US008081475B1

(12) United States Patent
Holley

(10) Patent No.: US 8,081,475 B1
(45) Date of Patent: Dec. 20, 2011

(54) HEAT SINKING ASSEMBLY AND METHOD FOR POWER ELECTRONICS IN A TROLLING MOTOR CONTROLLER HEAD

(75) Inventor: Steven E. Holley, Cushing, OK (US)

(73) Assignee: Brunswick Corporation, Lake Forest, IL (US)

( * ) Notice: Subject to any disclaimer, the term of this patent is extended or adjusted under 35 U.S.C. 154(b) by 137 days.

(21) Appl. No.: 12/474,675

(22) Filed: May 29, 2009

(51) Int. Cl.
*H05K 7/20* (2006.01)

(52) U.S. Cl. ........ 361/719; 361/704; 361/707; 361/709; 361/710; 257/718; 318/16; 440/6

(58) Field of Classification Search .................. 361/640, 361/658, 679.46, 688–690, 704, 707, 709, 361/710, 712, 713, 717, 719
See application file for complete search history.

(56) References Cited

U.S. PATENT DOCUMENTS

| 4,204,248 | A | * | 5/1980 | Proffit et al. .................. 361/707 |
| 4,802,532 | A | * | 2/1989 | Dawes et al. ................ 165/80.3 |
| 5,723,936 | A |   | 3/1998 | Wagner |
| 5,844,312 | A | * | 12/1998 | Hinshaw et al. .............. 257/718 |
| 5,892,338 | A | * | 4/1999 | Moore et al. ..................... 318/16 |
| 6,195,257 | B1 | * | 2/2001 | Janicek et al. ................ 361/704 |
| 6,902,446 | B1 | * | 6/2005 | Healey .............................. 440/6 |
| 2003/0112602 | A1 | * | 6/2003 | Lin ............................. 361/707 |
| 2006/0105642 | A1 | * | 5/2006 | Ries et al. .......................... 440/6 |
| 2008/0310167 | A1 | * | 12/2008 | Zaderej et al. ................ 362/294 |

* cited by examiner

*Primary Examiner* — Courtney Smith

(74) *Attorney, Agent, or Firm* — Andrus, Sceales, Starke & Sawall, LLP

(57) ABSTRACT

To prevent water intrusion, trolling motor heads cannot utilize ventilation methods of removing heat from power electronics. The assembly and method of the present application utilizes the existing metal column of a trolling motor to remove heat from the power electronics by utilizing a metal adapter that has flat outside surfaces for the power electronics and a round inside surface for the metal column.

19 Claims, 4 Drawing Sheets

HEAT SINKING ASSEMBLY AND METHOD FOR POWER ELECTRONICS IN A TROLLING MOTOR CONTROLLER HEAD

FIELD

The present application is directed to the field of trolling motors. More specifically, the present application is directed to the field of heat sinking power electronics design in trolling motors.

BACKGROUND

Trolling motors that utilize electronic variable speed control require power devices which have some level of resistance and must dissipate heat. This heat must be thermally conducted away from the internal devices to the external environment. Depending on the trolling motor size, large amounts of metal can be required for heat sinking, which is usually aluminum because of its high thermal conductivity. However, aluminum adds significant cost, especially if the controller head housing must be metal in order to assist with the heat sinking. The area and volume of heat sinking material required is also a significant factor in determining the head housing size and styling limitations.

An important limitation for heat sinks in a trolling motor head is the lack of ventilation or air flow across a heat sink that is mounted to the internal power devices because trolling motors need a good level of sealing to protect water from entering the head during use on water ways, during rain, and when washing the unit after use.

Heat sinks can be classified in terms of manufacturing methods and their final form shapes. The most common types of air-cooled heat sinks include:

Stampings—Copper or aluminum sheet metals are stamped into desired shapes. They are used in traditional air cooling of electronic components and offer a low cost solution to low density thermal problems. The problem for trolling motors is the lack of space and/or air flow across the stamped shape.

Extrusions—The most common heat sink for larger power devices because extrusions allow the formation of elaborate two-dimensional shapes capable of dissipating large heat loads. They may be cut, machined, and options added. Cross-cutting will produce omni-directional, rectangular pin fin heat sinks, and incorporating serrated fins improves the performance by approximately 10%-20%. Extrusion limits, such as the fin height-to-gap ratio and fin thickness, usually dictate the flexibility in design options. Typical fin height-to-gap aspect ratio is of up to 6:1 and a minimum fin thickness of about 1.3 mm are attainable with standard extrusion processes. Air flow across the fins is not possible in a sealed trolling motor.

Bonded/Fabricated Fins—Most air cooled heat sinks are convection limited, and the overall thermal performance of an air cooled heat sink can often be improved significantly if more surface area can be exposed to the air stream. High performance heat sinks utilize thermally conductive aluminum-filled epoxy to bond planar fins onto a grooved extrusion base plate. This process allows for a much greater fin height-to-gap aspect ratio of 20 to 40, greatly increasing the cooling capacity without increasing volume requirements. Large fin area requires the trolling motor to have an equally large head design.

Folded Fins—Corrugated sheet metal in either aluminum or copper increases surface area and the volumetric performance. The heat sink is then attached to either a base plate or directly to the heating surface via epoxy or brazing. It is not suitable for high profile heat sinks, but it allows high performance heat sinks to be fabricated for specific applications. Large fin area requires the trolling motor to have an equally large head design.

Previous designs for transferring the heat from power electronics of a trolling motor controller in the head have utilized a flat plate embedded in the housing or a completely metal housing, with the power electronics attached to the heat sink.

SUMMARY

The heat sink adapter and method allows for very compact construction with the power electronic components mounted on the controller printed circuit board and the heat sink adapter. Mounting the power electronics in this fashion allow for compact power electronics construction in the head, which in turn allows for smaller head size, better styling freedom, and lower cost opportunities.

DETAILED DESCRIPTION

The process of removing heat from a power device involves many separate thermal transfers from the heat input to the ambient air temperature. From these two basic elements, the entire heat flow can be established in electrical terms and illustrated schematically. The thermal generator is like a current source, thermal resistance is like a resistor and the thermal inertia or transient capacity of the various materials is like a capacitor. The transient capacity is the ability of heat sink material to absorb a quantity of heat for a short time, after which its temperature will rise in the same way as the voltage rises in a capacitor if the supply current is maintained.

Figure 1:
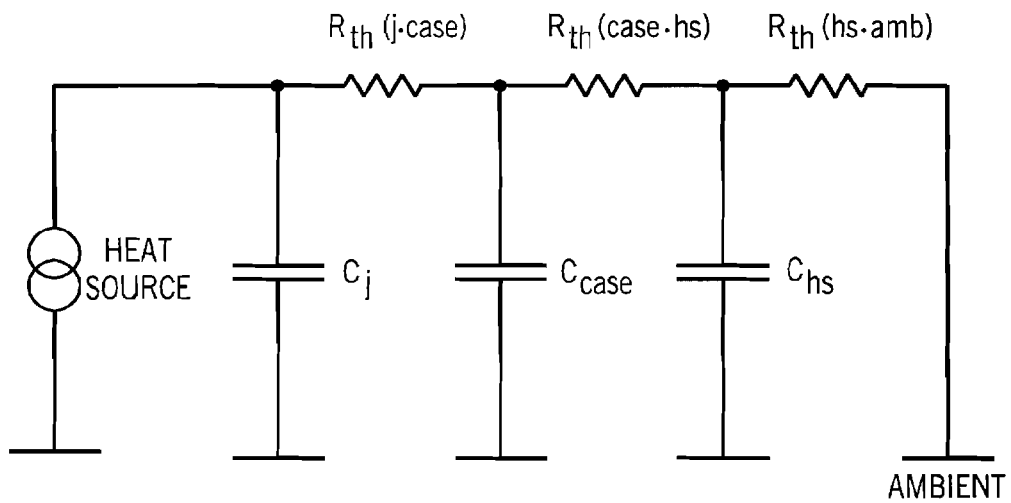
FIG. 1 is a schematic diagram illustrating heat flow from a heat source generator to ambient of a trolling motor controller head assembly.

FIG. 1 is a schematic diagram illustrating the thermal system and characteristics of a trolling motor. The Heat Source is separated from the Ambient by the thermal resistance from junction to case Rth (j case), the thermal inertia of the junction Cj, which is very small, the thermal inertia of the case itself C case (also small), the thermal resistance from the case to the heat sink Rth (case hs), thermal inertia of the heat sink C hs, and finally the thermal resistance from the heat sink to ambient Rth (hs amb). The small thermal inertia values Cj, C case, Chs will heat up very rapidly and the heat sink itself will only absorb so much heat. A state of equilibrium is required where the heat input equals the heat output, but without the junction temperature reaching a dangerous level.

The heat sink adapter and method of the present application allows for very compact construction with the power electronic components or the motor mounted to the controller printed circuit board and to the heat sink adapter. This compact power electronics construction allows for smaller head size and better styling opportunities.

In the system and method of the present application, heat from the power electronics is conducted into the trolling motor column which is inserted inside the heat sink adapter. Conduction distance is very short, being only the thickness of the adapter (see FIG. 4). When the motor is operated, as much as 50% of the column is in the water and the water acts as an ideal heat dissipating body (see FIG. 6). A more detailed description of the assembly and method is included below.

Figure 2:
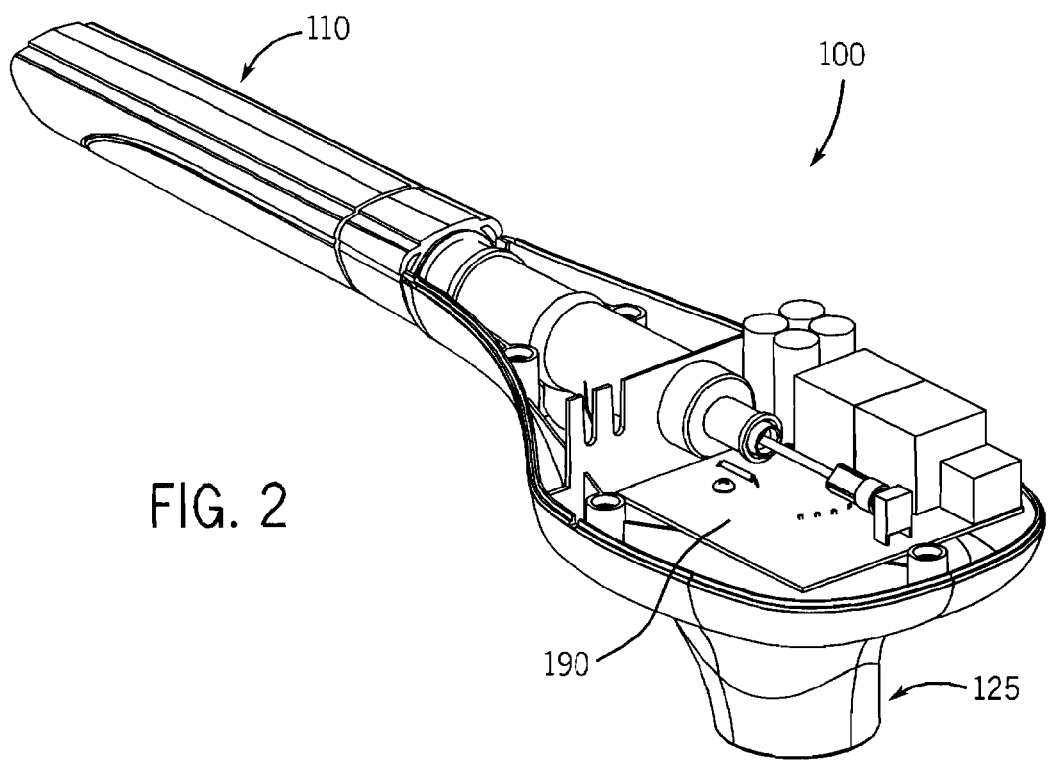
FIG. 2 is a top elevation view illustrating a trolling motor head assembly of the present application.

Referring to FIG. 2, a controller head assembly 100 of the present application is depicted, and in this case, the controller head assembly 100 is illustrated without a controller head cover, thus exposing the controller board 190. It should be understood that this configuration is not typical for operating the trolling motor, but is intended to provided an illustrative view of the inside of the controller head assembly 100 and the controller board 190 only. Further illustrated is the throttle shaft 110 used by a user to control the throttle, direction and steering of the trolling motor, and a column cover 125 configured to protect a junction between the column (not shown) and the controller head assembly 100. The controller board 190 is preferably configured in a horizontal fashion as shown in the controller head assembly 100 and includes a number of components required for the operation of the trolling motor on its top side. Power devices 140 (not shown) that are further utilized in the operation of the trolling motor, are connected to the bottom side of the controller board 190, and are not visible in this view. It is these power devices 140 that generate the heat requiring reliable heat sinking capabilities.

Figure 3:
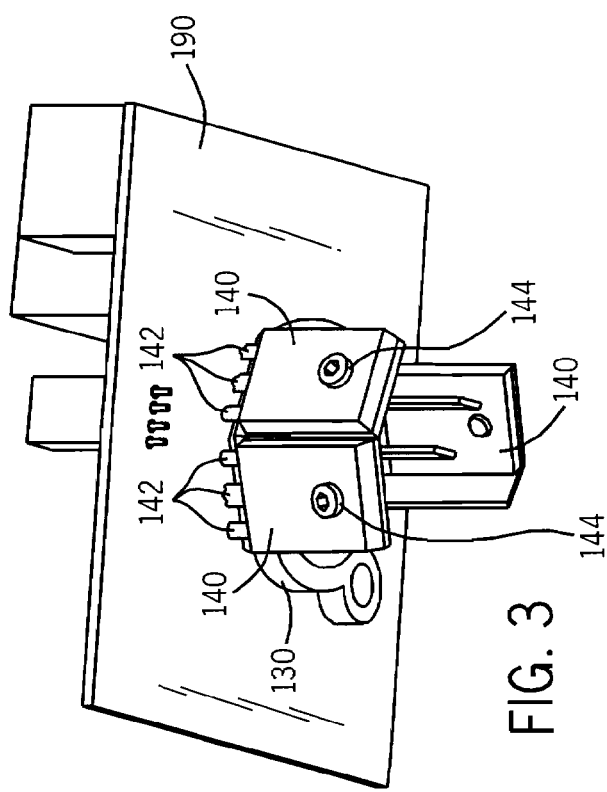
FIG. 3 is a top elevation view illustrating a controller board with power electronics according to an embodiment of the present application.

Referring to FIG. 3, the controller board 190 is viewed from below, where the power devices 140 are electrically attached to the control board 190 by utilizing power connectors 142 that connect through the controller board 190 to the components on the top side of the control board 190. In this embodiment, the power devices 140 are rectangular in shape, and have flat surfaces, not arching or curved faces. The power devices 140 include some type of securing device, in this embodiment screws 144 that attach the power devices 140 to the heat sink sleeve which will be discussed in further detail below. Also coupled with the control board 190 is an insulator pad 130. The insulator pad 130 is preferably made out of rubber material, but may be fabricated from any non-conducting material. The dual purpose of the insulator pad 130 will also be discussed further below with respect to FIG. 4.

Figure 4:
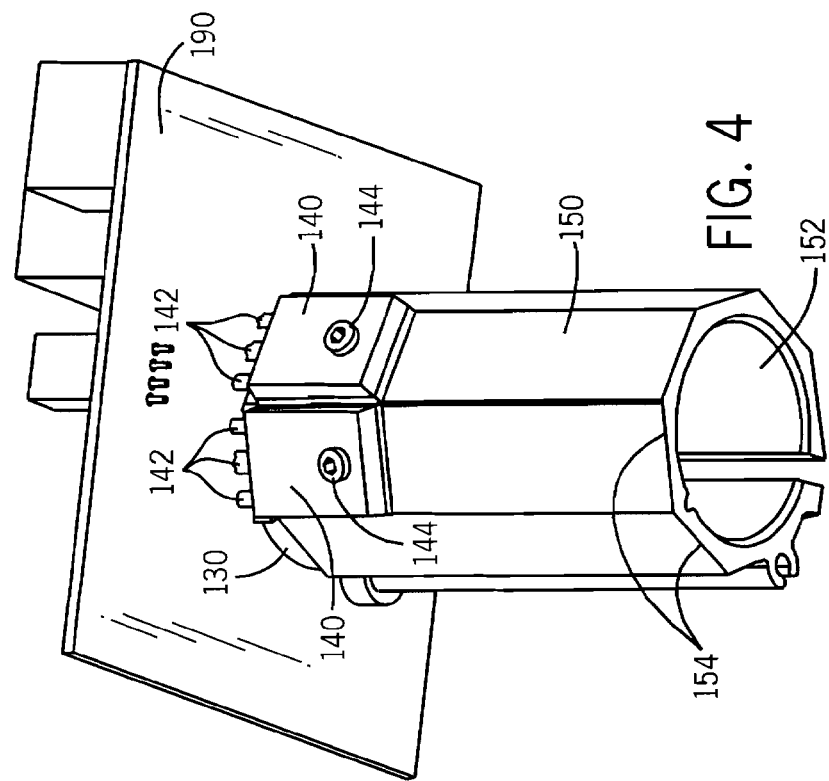
FIG. 4 is a bottom elevation view illustrating a controller board including power electronics mounted to a heat sink adapter according to an embodiment of the present application.

Referring now to FIG. 4, the illustration from FIG. 3 is replicated but with the heat sink adapter 150 coupled to the power devices 140 and separated from the controller board by the insulator pad 130. The insulator pad 130 is preferably fabricated to receive the heat sink adapter 150 and facilitate a water tight seal with the adapter 150, but not to be physically coupled or adhered to the heat sink adapter 150. The heat sink adapter 150 is preferably fabricated from an aluminum alloy, or another metallic material with a high heat transfer rate. The heat sink adapter 150 is preferably a one piece sleeve, but may also be made up of a number of separate pieces each of which being fastened to the power devices 140 with the screws 144 or other securing device. The inner surface 152 of the heat sink adapter 150 is fashioned to receive a column (not shown) of the trolling motor, maintaining continuous contact between the inner surface 152 of the heat sink adapter 150 and the column. The outer surface 154 of the heat sink adapter 150 is fashioned such that the flat surfaces of the power devices 140 maintain continuous contact with the outer surface 154 of the heat sink adapter 150. In further embodiments, it is contemplated that if the power control devices 140 have a curved shape with a curved inside surface, then the heat sink sleeve 150 may also be fashioned to have an outer surface 154 that is curved such that the two surfaces remain in continuous contact with one another. It is then contemplated that the either or both of the inner and outer surfaces 152, 154 of the heat sink adapter 150 may be fashioned to match and maintain surface centered with the column and the power control devices 140, respectively.

Still referring to FIG. 4, the heat sink adapter 150 is further fashioned such that the top circular shaped edge maintains a continuous seal with the insulator pad 130. It should be noted that the insulator pad 130 has a generally circular shape that may define and/or encircle an opening in the controller board 190. In this embodiment, this allows wiring needed to go to the motor at the end of the column (both not shown) to run from the motor up the column, and through the controller board 190 to the appropriate connectors. The insulator pad 130 ensures that the heat sink adapter 150 does not conduct electric current form the controller board 190, while also providing an additional seal to prevent water from entering the column and damaging the wiring and/or motor.

Figure 5:
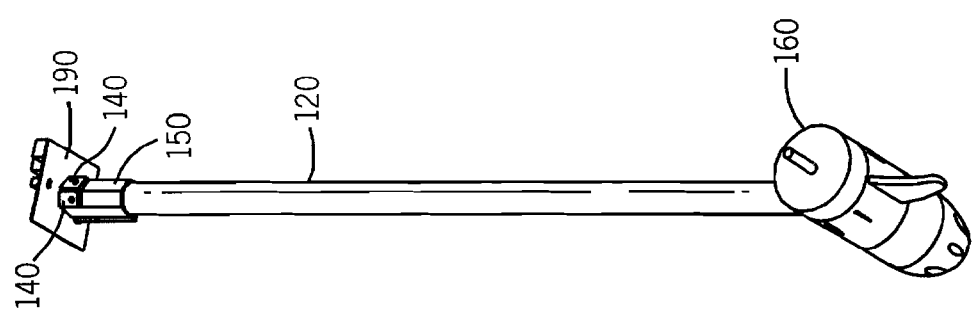
FIG. 5 is a bottom elevation view illustrating a power electronics heat sink adapter mounted to a trolling motor metal column according to an embodiment of the present application.

A more thorough illustration of how the column 120 is fitted into the heat sink adapter 150 is depicted in FIG. 5. Here, once again the controller board 190 includes connections that connect to the power devices 140. The power devices 140 are coupled with the heat sink sleeve 150 such that the heat sink sleeve 150 is held tight against the insulation pad 130 (not specifically shown). The column 120 is inserted into the heat sink adapter 150 also such that the top edge of the circular column creates a seal with the insulator pad 130. The column 120 is preferably fashioned from an aluminum alloy or stainless steel, or another metallic material having a high heat transfer rate. The motor unit 160 is coupled to the distal end of the column 120. Referring back to FIG. 4, the column 120 is fitted into the heat sink adapter 150, and in some embodiments the heat sink adapter 150 will include a tightening means such as a screw or a clamp (not shown) that tighten the heat sink adapter 150 around the column 120.

Figure 6:
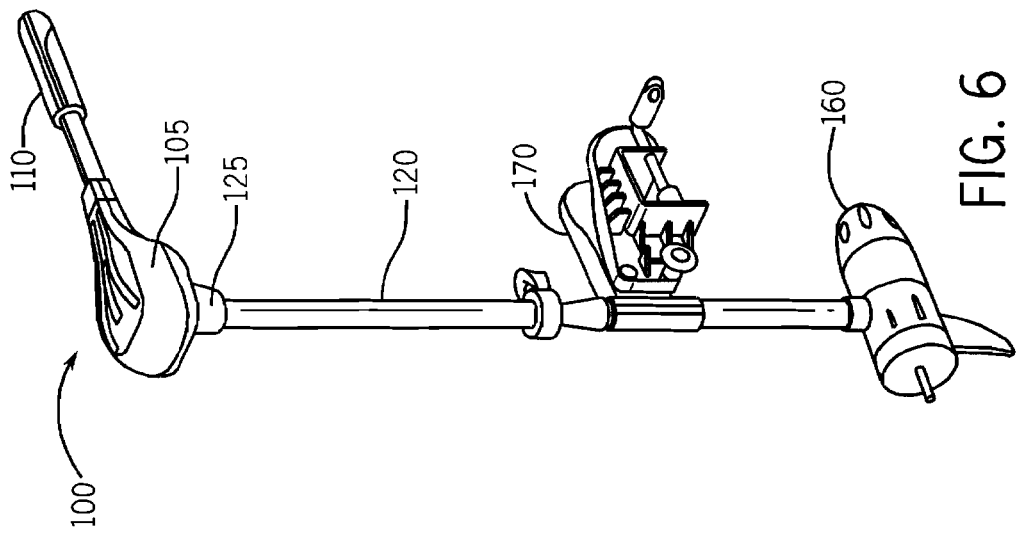
FIG. 6 is a top elevation view illustrating a trolling motor including the power electronics heat sink adapter, positioned for use, according to an embodiment of the present application.

Referring now to FIG. 6, in operation the controller head assembly 100 utilizes a controller head cover 105 to protect the controller board 190 and the other components from water and the elements. A user utilizes the throttle shaft 110 to steer, choose direction and the speed of the trolling motor. The column 120 is inserted into the heat sink adapter 150 (not shown) and fastened accordingly. A column cover 125 is then used for further sealing off of the internal components of the controller head assembly 100 from water. A mount 170 mounts the entire trolling motor including the controller head assembly 100 to a boat. When deployed, the motor 160 is lowered into the water and the motor is turned on. The heat from the power devices 140 is transferred through the heat sink adapter 150 and into the column 120 where the heat is dissipated into the ambient air and/or the water while deployed.

Figure 7:
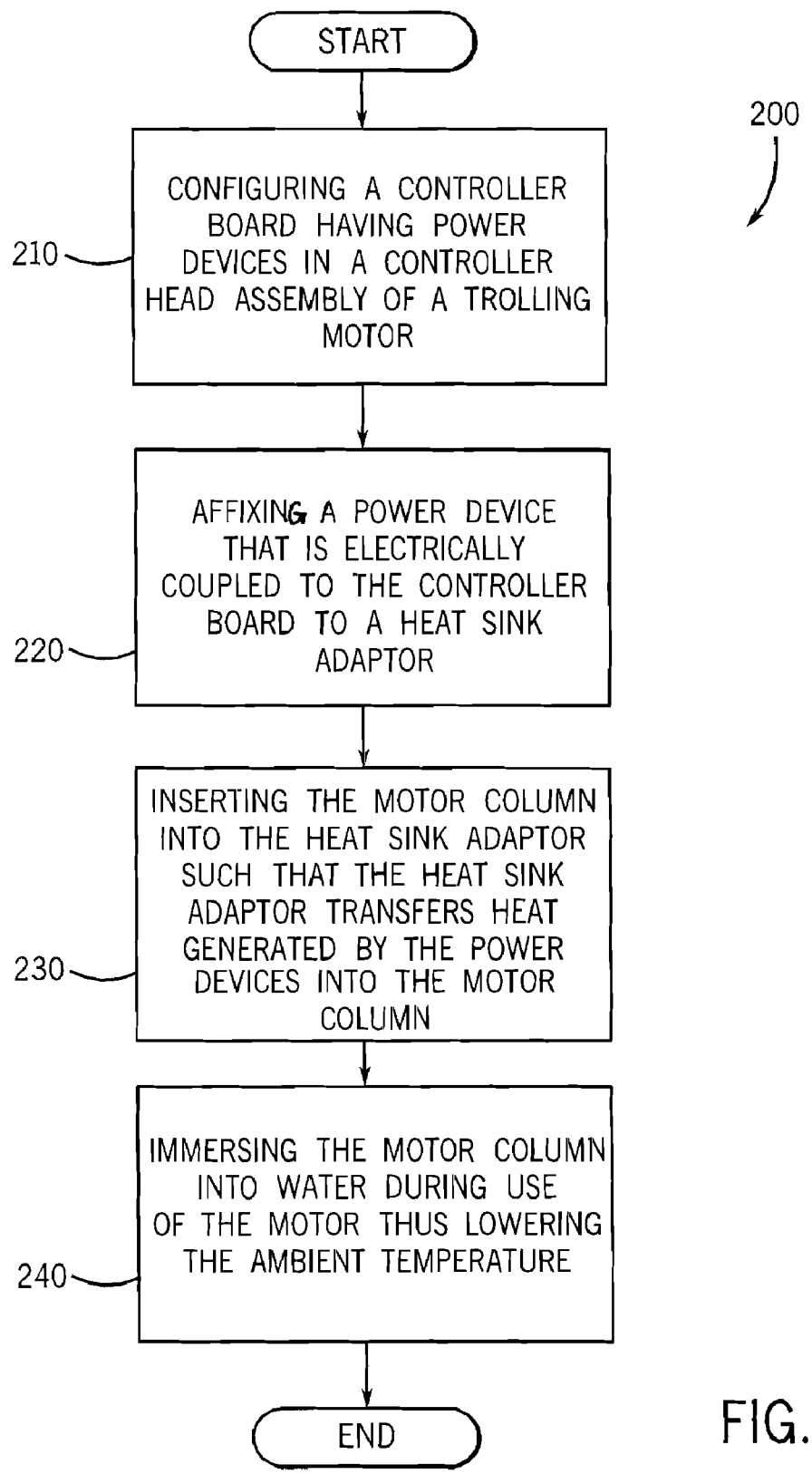
FIG. 7 is a flow chart illustrating a method according to an embodiment of the present application.

Now referring to FIG. 7, a method 200 of heat sinking power electronics in a trolling motor controller head is depicted. In step 210, a controller board having power electronics is configured in a controller head assembly of a trolling motor. The controller board is configured in the controller head such that the power devices are located on the underside of the controller board when the controller board is configured horizontally in the controller head. The remainder of the controller board circuitry is configured on the top side of the controller board. The controller board is further configured such that the plane of the controller board is perpendicular to and intersected by the column of the trolling motor. In step 220, a heat sink adapter is affixed to the power devices that are configured on the bottom side of the controller board. Once again, preferably the power devices are affixed to the heat sink adapter using screws or another securing device known in the art, and the outside surface of the heat sink adapter is configured such that the inside surface of the power device maintains continuous contact with the outside surface of the heat sink adapter, thus facilitating optimum heat transfer. An insulator pad separates the heat sink adapter from the controller board, simultaneously creating a continuous seal between the two components. It should further be noted that the power devices are electrically coupled to the controller board through apertures formed in the controller board. In step 230, the column is inserted into the heat sink adapter such that the heat sink adapter transfers the heat generated by the power device into the column. Once again, the heat sink adapter is configured such that the inside surface of the heat sink adapter creates a continuous interface with the column surface, thus optimizing heat transfer from the heat sink adapter to the column. In step 240, the column is immersed into water during use of the motor, thus lowering the ambient temperature, and allowing for the heat transfer from the column to transfer into the water, as well as into the air.

The present invention has been described in terms of specific embodiments incorporating details to facilitate the understanding of the principals of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A trolling motor heat sink assembly, the heat sink assembly comprising:
a heat sink adapter fashioned in a cylindrical shape, the heat sink adapter having an outer surface for maintaining surface contact with a planar surface of a power device, wherein a first end of the heat sink adapter is fastened to the power device;
a motor column of the trolling motor, the heat sink adapter having an inner surface for receiving the motor column in to a second end of the heat sink adapter and maintaining surface contact with an outer surface of the motor column such that heat generated by the power device is dissipated through the heat sink adapter and the motor column,
wherein the heat sink adapter secures the motor column in an operating position;
an insulator pad fitted on the first end of the heat sink adapter; and
a controller board including a set of power connectors, the set of power connectors electrically coupling the power device with a top surface of the controller board through an aperture of the controller board,
wherein the insulator pad electrically insulates the heat sink adapter from the controller board, and further wherein the insulator pad provides a seal between the heat sink adapter and the controller board.

2. The heat sink assembly of claim 1, wherein the heat sink adapter is a one piece adapter.

3. The heat sink assembly of claim 1, wherein the heat sink adapter comprises a plurality of body pieces.

4. The heat sink assembly of claim 1, wherein the heat sink adapter is fashioned from an aluminum alloy.

5. The heat sink assembly of claim 1, wherein the motor column is fashioned from a metallic alloy.

6. The heat sink assembly of claim 1, wherein the inside surface of the heat sink adapter has a circular cross section.

7. The heat sink assembly of claim 1, wherein the outside surface of the heat sink adapter has a polygonal cross section.

8. The heat sink assembly of claim 1, wherein when the trolling motor is in the operating position, the motor column is immersed in water, such that further heat dissipation from the power device is effectuated through the water.

9. The heat sink assembly of claim 1, wherein the controller board is affixed in a controller head assembly on a horizontal plane and the heat sink adapter and the motor column extend vertically from a bottom surface of the controller board.

10. A method of providing heat dissipation for a power device coupled with a controller board in a head assembly of a trolling motor, the method comprising:
affixing the power device to a first end of a heat sink adapter, wherein the power device is electrically coupled with the controller board;
inserting a motor column of the trolling motor into the heat sink adapter, wherein the heat sink adapter transfers heat generated by the power device into the motor column;
fitting an insulator pad on the first end of the heat sink adapter;
electrically coupling with a set of power connectors the power device with a top surface of a controller board through an aperture of the controller board;
electrically insulating the heat sink adapter from the controller board with the insulator pad; and
forming a seal between the heat sink adapter and the controller board with the insulator pad.

11. The method of claim 10, wherein the heat sink adapter is a one piece adapter.

12. The method of claim 10, wherein the heat sink adapter comprises a plurality of body pieces.

13. The method of claim 10, wherein the heat sink adapter is fashioned from an aluminum alloy.

14. The method of claim 10, wherein the motor column is fashioned from a metallic alloy.

15. The method of claim 10, wherein the inside surface of the heat sink adapter has a circular cross section.

16. The method of claim 10, wherein the outside surface of the heat sink adapter has a polygonal cross section.

17. The method of claim 10, further comprising immersing the motor column in water when the trolling motor is in the operating position, such that further heat dissipation from the power device is effectuated.

18. The method of claim 10, further comprising affixing the controller board in a controller head assembly on a horizontal plane, wherein the heat sink adapter and the motor column extend vertically from a bottom surface of the controller board.

19. A trolling motor heat sink assembly, the heat sink assembly comprising:

a heat sink adapter fashioned in a cylindrical shape, the heat sink adapter having an outer surface for maintaining surface contact with a planar surface of a power device, wherein a first end of the heat sink adapter is fastened to the power device;

a motor column of the trolling motor, the heat sink adapter having an inner surface for receiving the motor column in to a second end of the heat sink adapter and maintaining surface contact with an outer surface of the motor column such that heat generated by the power device is dissipated through the heat sink adapter and the motor column; and a controller board electrically coupled with the power device and having an insulator pad configured to receive the first end of the heat sink adapter and to electrically insulate the heat sink adapter from the controller board.

* * * * *